United States Patent
Schrepfer

(10) Patent No.: US 10,386,426 B2
(45) Date of Patent: Aug. 20, 2019

(54) DETECTING A FAILURE OF A PHASE IN A GRID FOR INVERTERS HAVING A FREQUENCY DETECTION IN AN INTERMEDIATE DC VOLTAGE LINK

(71) Applicant: Schmidhauser AG, Romanshorn (CH)

(72) Inventor: Andreas Schrepfer, Wittenbach (CH)

(73) Assignee: Schmidhauser AG, Romanshorn (CH)

( * ) Notice: Subject to any disclaimer, the term of this patent is extended or adjusted under 35 U.S.C. 154(b) by 445 days.

(21) Appl. No.: 15/198,771

(22) Filed: Jun. 30, 2016

(65) Prior Publication Data

US 2017/0234936 A1    Aug. 17, 2017

(30) Foreign Application Priority Data

Jun. 30, 2015   (DE) .......................... 10 2015 110 460

(51) Int. Cl.

| | | |
|---|---|---|
| *G01R 1/20* | (2006.01) | |
| *G01R 31/42* | (2006.01) | |
| *G01R 31/02* | (2006.01) | |
| *H02M 1/084* | (2006.01) | |
| *H02M 7/04* | (2006.01) | |
| *H02M 7/44* | (2006.01) | |
| *G01R 31/40* | (2014.01) | |

(52) U.S. Cl.
CPC .............. *G01R 31/42* (2013.01); *G01R 1/20* (2013.01); *G01R 31/02* (2013.01); *H02M 1/084* (2013.01); *H02M 7/04* (2013.01); *H02M 7/44* (2013.01); *G01R 31/40* (2013.01)

(58) Field of Classification Search
None
See application file for complete search history.

(56) References Cited

U.S. PATENT DOCUMENTS

| | | | | |
|---|---|---|---|---|
| 4,152,651 A | * | 5/1979 | Lampert | .................. H04B 1/16 375/130 |
| 4,427,950 A | * | 1/1984 | Akagiri | .................. H03G 9/025 330/149 |
| 6,396,345 B2 | * | 5/2002 | Dolman | ................ H03F 1/3247 330/149 |
| 7,388,497 B1 | * | 6/2008 | Corbett | ................ G06K 7/0008 340/572.1 |
| 9,036,382 B2 | | 5/2015 | Li et al. | |

(Continued)

FOREIGN PATENT DOCUMENTS

DE      10244765 A1   4/2003

*Primary Examiner* — Melissa J Koval
*Assistant Examiner* — Nasima Monsur
(74) *Attorney, Agent, or Firm* — Stevens & Showalter, LLP

(57) ABSTRACT

A detection of a failure of a phase (as a method and apparatus) in a system—supplied by multiple phases—including a DC link (5) is suggested. A rectified voltage (10) of the DC link (5) pulses at a multiple of the mains frequency as a fundamental wave. The rectified voltage (10) is filtered for detecting a signal component at the double frequency of the mains frequency (12). The rectified voltage (10) is also "filtered" for detecting an average link voltage (14). A ratio signal (17) is formed as a ratio of the average link voltage (14) to the signal component at the double frequency of the mains frequency (12). An error detection signal (19) results from a comparison of the ratio signal (17) with an error threshold (20).

20 Claims, 3 Drawing Sheets

(56) References Cited

U.S. PATENT DOCUMENTS

| | | | |
|---|---|---|---|
| 2008/0180087 A1* | 7/2008 | Pankau | H02H 3/253 |
| | | | 324/76.74 |
| 2009/0185398 A1* | 7/2009 | Cuk | H02M 1/34 |
| | | | 363/21.1 |
| 2010/0207634 A1 | 8/2010 | Wang | |
| 2011/0194318 A1* | 8/2011 | Kono | H02M 7/53875 |
| | | | 363/37 |
| 2013/0073126 A1 | 3/2013 | Kumar et al. | |
| 2014/0254217 A1* | 9/2014 | Li | G01R 21/06 |
| | | | 363/37 |

\* cited by examiner

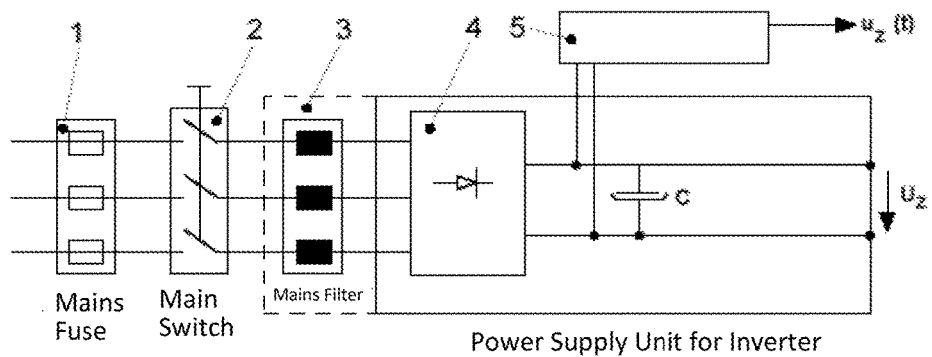
Fig. 1
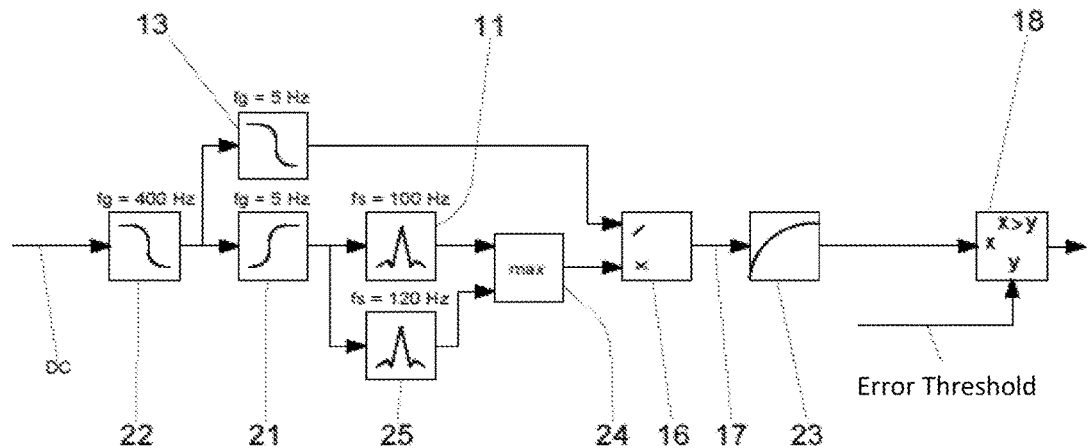
Fig. 3
Fig. 4
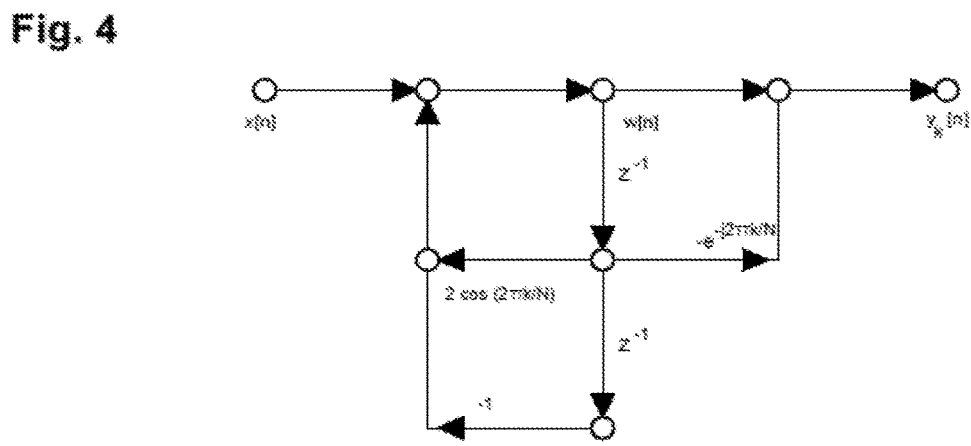

DETECTING A FAILURE OF A PHASE IN A GRID FOR INVERTERS HAVING A FREQUENCY DETECTION IN AN INTERMEDIATE DC VOLTAGE LINK

The inventions generally relate to circuit arrangements, so-called inverters or drive device controllers, used for controlling electric drive machines. These are widely used in industrial applications.

Power failure signals are generated in drive device controllers in order to avoid damage to or destruction of such controllers and such drives, cf. U.S. Pat. No. 9,036,382 (Bing Li, Rockwell). Here, the effect is utilized that a failure of a phase of the three-phase power supply voltage results in a change in the signal characteristics in the DC link of such a controller. In particular, threshold values used for detecting the phase failure are infringed due to the changed signal characteristics. In the case of a detection of a phase failure, the controller stops the drive machines driven thereby in order to avoid damage to the controller due to the increased current of the remaining phases and to counter deterioration of the true running of the drive machines. In the mentioned document, this is accomplished by means of bandpasses in a not unfavorable manner, see 152 and column 2, lines 33 to 60, therein.

However, threshold values are required to be defined depending on the supply voltage. Such threshold values may comprise, for example, detection voltages which, when compared with detected voltages of the error detection unit, trigger an error signal. In particular, fluctuations in the supply voltage may lead to a situation, in which a voltage failure cannot be reliably detected. Such voltage fluctuations are often of temporary nature and are thus difficult to predict. Furthermore, additional hardware and software efforts are to be made for detecting the thresholds and for appropriate evaluation thereof by means of a variety of signals.

It would thus be desirable to further increase the reliability of the system in the case of voltage fluctuations.

It may thus be considered the problem to be solved to increase the robustness of a drive device controller, especially in the case of voltage fluctuations.

The problem is accounted for by a claimed method (claim 1). It detects the failure of a phase in a system supplied by multiple phases and including a DC link, wherein a rectified voltage of the DC link pulses at a multiple of a mains frequency as a fundamental wave. The rectified voltage is filtered for detecting a signal component at the double frequency of the mains frequency. The rectified voltage is filtered for detecting an average link voltage. A ratio signal is determined as a ratio of the average link voltage to the signal component at the double frequency of the mains frequency. An error detection signal is detected from a comparison of the ratio signal with an error threshold.

The problem is accounted for by a claimed apparatus (claim 16). The apparatus for detecting the failure of a phase in a system supplied by multiple phases and including a DC link, wherein a rectified voltage of the DC link pulses at a multiple of a mains frequency as a fundamental wave. A first filter is provided for filtering the rectified voltage for detecting a signal component at the double frequency of the mains frequency. A further filter accomplishes filtering of the rectified voltage for detecting an average link voltage. A determination unit accomplishes determination of a ratio signal as a ratio of an average link voltage to a signal component at the double mains frequency. A detection circuit accomplishes detection of an error detection signal from a comparison of the ratio signal with an error threshold.

Advantageous designs and further developments are the subject matter of the respective dependent claims which are incorporated herein.

Claims 2 to 15 substantially also relate to claim 16 without being dependent on claim 1.

According to a first invention, a method for detecting the failure of a phase in a system—supplied by multiple phases—including a DC link is claimed, wherein a rectified voltage of the DC link pulses at a multiple of a mains frequency as a fundamental wave.

The method comprises filtering the rectified voltage for detecting a signal component at the double frequency of the mains frequency. The rectified voltage is filtered for detecting an average link voltage. A ratio signal is determined as a ratio of the average link voltage to the signal component at the double frequency of the mains frequency.

An error detection signal is detected from a comparison of the ratio signal with an error threshold. The threshold for the phase failure is advantageously defined as a percentage. An indication of absolute values can be omitted (claim 11). Accordingly, independence of the current mains voltage is given.

In embodiments, the signal component at the double frequency of the mains frequency can further be detected by means of a Goertzel filter. This filter advantageously provides the Fourier coefficient and the frequency component from a signal, respectively, at the desired frequency.

In embodiments, the Goertzel filter can further be configured as a second-order filter. Advantageously, this configuration requires little computing time and is easy to realize.

In further embodiments, the mains frequency can be parameterizable. Advantageously, the method can thus be adapted to various mains frequencies which may deviate from each other, for example, in the case of a local voltage supply.

In embodiments, high-pass filtering can precede the filtering of the rectified voltage for detecting the signal component at the double frequency of the mains frequency. Thus, failures due to the link voltage being higher by a multiple are advantageously eliminated.

In embodiments, the filtering of the rectified voltage for detecting the average link voltage can be performed by means of a low-pass filter. The aliasing effect can advantageously be eliminated thereby. In the field of signal analysis, such errors, which occur when frequency components higher than the Nyquist frequency (half the sampling frequency) are present in the signal to be sampled, are referred to as aliasing.

In further embodiments, low-pass filtering of the rectified voltage can precede the filtering of the rectified voltage for detecting the signal component at the double frequency of the mains frequency and the filtering of the rectified voltage for detecting the average link voltage. The aliasing effect is advantageously reduced thereby as well.

In embodiments, low-pass filtering can precede the detection of the error detection signal from a comparison of the ratio signal with the error threshold. Signal fragments of load steps can be eliminated in this way which could otherwise result in false alarm(s).

In embodiments, the filtering of the rectified voltage for detecting the signal component at the double frequency of the mains frequency can be performed in parallel for alternative mains frequencies. The device is thus suitable for a plurality of mains frequencies.

In further embodiments, finding a maximum can succeed the parallel detection of the signal components at the double frequency of alternative mains frequencies, the result of which, in turn, forms the basis of the determination of the ratio signal. In this way, the larger error signal and thus the applied mains frequency are advantageously considered automatically.

In embodiments, the determination of the ratio signal can take a correction factor into account, which considers a ratio of the average link voltage to Fourier coefficients of the average link voltage at the double mains frequency. Thus, a value close to the actual values can be advantageously determined by a Fourier-transformed measurement.

Determination of the error threshold (claim 11) can take a correction factor into account, which is formed by a ratio between an "absolute value" (an amplitude value) of a spectral component and an amplitude of the ripple voltage. The spectral component preferably is the fundamental wave (the one having the largest amplitude).

In embodiments including a Fourier-transformed measurement, the correction factor can (substantially) be 0.7. The actual signal can be deduced therefrom (claims 12, 13).

A further invention relates to the detection of the failure of a phase in a system—supplied by multiple phases—including a DC link, wherein a rectified voltage of the DC link pulses at a multiple of a mains frequency as a fundamental wave (claim 16). The apparatus can be a circuit (claim 17).

The apparatus comprises a first filter for the rectified voltage for detecting a signal component at the double frequency of the mains frequency. Furthermore, it comprises a second filter for the rectified voltage for detecting an average link voltage. Moreover, it comprises a unit for determining a ratio signal. The signal is created as a ratio of the average link voltage to the signal component at the double mains frequency. A circuit is adapted for detecting an error detection signal from a comparison of the ratio signal with an error threshold.

The threshold for the phase failure is advantageously defined as a percentage. An indication of absolute values is omitted (claims 18 to 22). Accordingly, independence of the current mains voltage is given.

Some embodiments of the claimed invention are explained in greater detail in the following with reference to the figures.

FIG. 1 shows a first structure of a drive device controller (an inverter) according to one embodiment.

FIG. 3 shows circuit components and the dimensioning of the embodiment by way of example.

FIG. 4 shows an embodiment of a second-order Goertzel filter.

Figure 2:
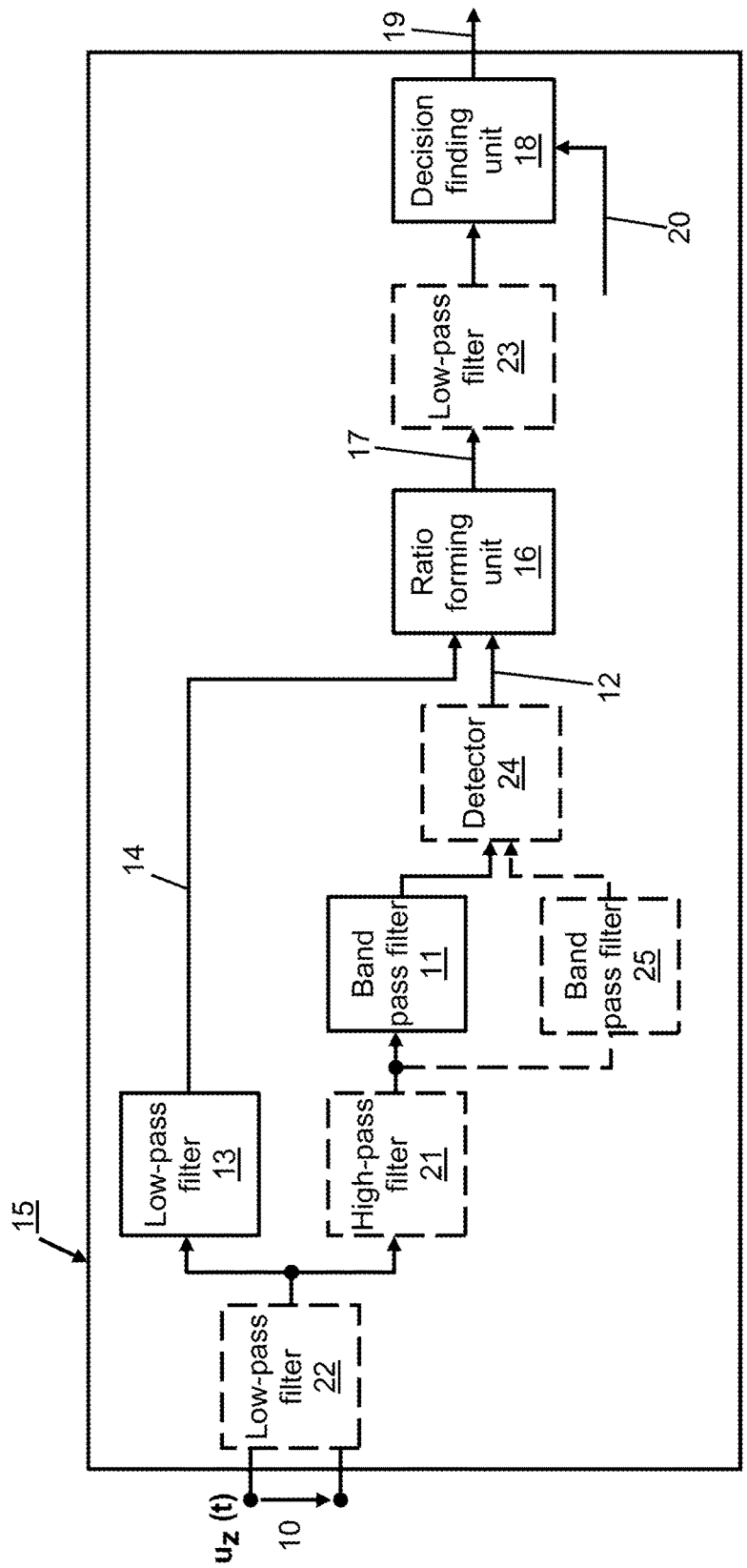
FIG. 2 shows an equivalent circuit diagram of the embodiment.

Various embodiments will now be described in greater detail with reference to the drawings, in which some embodiments are illustrated. For the sake of clarity, the thickness dimensions of lines, layers and/or regions can be illustrated in an exaggerated manner in the figures.

Even though embodiments can be modified and altered in various ways, embodiments are illustrated as examples in the figures and will be described in detail herein. It is not intended to limit embodiments to the respective disclosed forms, embodiments are rather intended to cover all functional and/or structural modifications, equivalents and alternatives included in the scope of the invention. Identical reference numerals designate identical or similar elements throughout the entire description of the figures.

It is to be noted that an element, which is described as "connected" or "coupled" to another element, can be connected or coupled directly to the other element, or that intermediate elements can be provided. However, when an element is described as "directly connected" or "directly coupled" to another element, no intermediate elements are present. Other terms which are used to describe the relationship between the elements are to be interpreted similarly (e.g. "between" as opposed to "directly between", "adjacent" as opposed to "directly adjacent", etc.).

The terminology used herein only serves the purpose of describing specific embodiments and is not supposed to limit the embodiments. As used herein, the singular forms "a" and "the" are supposed to include also the plural forms unless the context clearly states otherwise.

Unless otherwise defined, all terms used herein (including technical and scientific terms) have the same meaning ascribed to them by a person skilled in the art knowledgeable in the field, to which the embodiments belong. Furthermore, it is to be made clear that expressions, for example those defined in generally used dictionaries, are to be interpreted as if they had the meaning consistent with their meaning in the context of the relevant technology, and are not to be interpreted in an idealized or excessively formal sense, unless this is explicitly stated here.

FIG. 1 shows a drive device controller for operating drive machines, wherein substantially the three phases of the common AC voltage are supplied to the system, here to a power supply unit for the inverter, via mains fuses 1, a main switch 2 and a mains filter 3. The applied voltages are rectified in the system, which is favorably performed in a "diode matrix" (six diodes in a bridge circuit) not shown in detail here. The thus rectified voltage $U_z$ (or when still rippled $u_z(t)$ having reference numeral 10) is detected by a link voltage detection circuit 5 generating the drive voltage for the servo inverter(s) of the system—not shown here—which are provided for voltage supply of the drive machine(s)—not shown either. Furthermore, this voltage $U_z$ is provided for supply of these servo inverters after smoothing by downstream capacitors.

FIG. 2 is an equivalent circuit diagram of the link voltage detection according to various embodiments for error detection. Here, the optional components are indicated by dashed lines. The input voltage $U_z$ (or 10 in FIG. 2) is filtered by an optional low-pass 22, which is configured as an antialiasing filter. The filter output branches to a further low-pass 13 for generating the average link voltage 14. On the other hand, the DC component of the voltage $U_z$ (or 10) is filtered out by a high-pass filter 21.

Then, a frequency detection is performed, for example for the input voltage of 50 Hz with $f_s=100$ Hz, and for the input voltage of 60 Hz with $f_s=120$ Hz, in the bandpasses 11 and 25 configured as Goertzel filters.

A maximum detector 24 is coupled to the outputs of these filters and passes the respective larger signal 12 on to the ratio forming unit 16. The latter is further provided with the average link voltage 14. The ratio forming unit 16 relates the applied frequency detection signals 12 to the average link voltage 14.

Then, the ratio signal 17 resulting therefrom is provided to the low-pass filter 23 for elimination of false decisions due to signal fragments which can be generated by load steps.

Then, the thus filtered signal is provided to the decision finding unit 18 which is further provided with a threshold value for the phase failure. This threshold value preferably has no absolute voltage, but a specified ratio which is compared with the modified ratio signal 17.

The error signal 19 is now output at the output side.

FIG. 3 shows circuit components and the dimensioning of the embodiment of FIG. 2 by way of example.

The antialiasing low-pass filter 22 having a cutoff frequency of 400 Hz is included therein and is connected, on the one hand, to the low-pass 13 with a cutoff frequency of 5 Hz, the output of which is provided to the ratio forming unit 16. On the other hand, the low-pass filter 22 is connected to a Goertzel filter with $f_s$=100 Hz via a high-pass filter with $f_g$=5 Hz and, in parallel thereto, to a Goertzel filter with $f_s$=120 Hz. Both filter outputs are also provided to the ratio forming unit 16 via a maximum detection circuit 24.

The output thereof is provided to the low pass 23 with τ=750 ms. The output thereof is provided to the decision finding unit 18, which is also provided with the error threshold 20. The decision finding unit 18 provides the error detection signal 19 (mains phase failure) at the output side.

FIG. 4 shows an embodiment of a second-order Goertzel filter.

Here, the following applies:

$$H_k(z) = \frac{1 - e^{j\frac{2\pi}{N}k} \cdot z^{-1}}{1 - 2 \cdot \cos\left(2\pi\frac{k}{N}\right) \cdot z^{-1} + z^{-2}}$$

Starting conditions $$w[-1]=0$$

$$w[-2]=0$$

calculate in each cycle $$w[n] = x[n] + 2\cos\left(\frac{2\pi}{N}k\right) \cdot w[n-1] - w[n-2]$$

$$0 \leq n \leq N-1$$

calculate only in the $N^{th}$ cycle $$y_k[N] = w[N] - e^{-j\frac{2\pi}{n}k} \cdot w[N-1]$$

Figure 5:
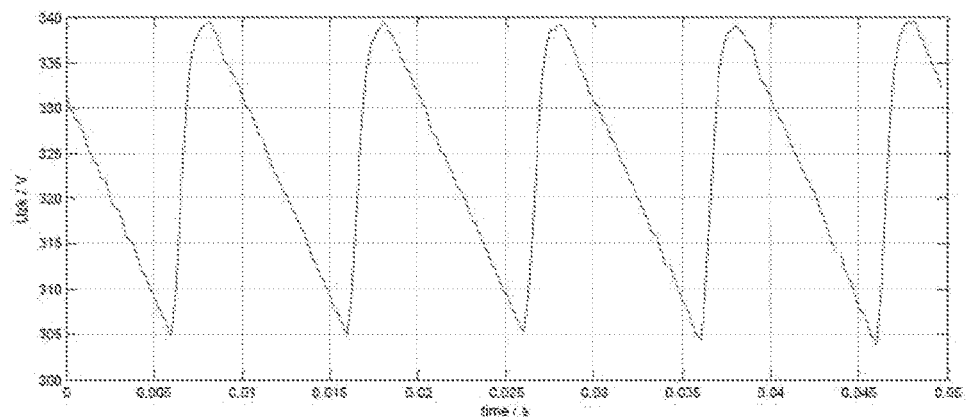
FIG. 5 shows an example of a link voltage in the time domain.

FIG. 5 shows the voltage curve of a link voltage in the time domain by way of example. The shown ripple voltage is not really sinusoidal. It rather resembles a saw tooth and is hence composed of a plurality of frequency components. In exemplary measurements, the ripple voltage has approx. 35V from peak to peak or an amplitude of approx. 17.5V.

Figure 6:
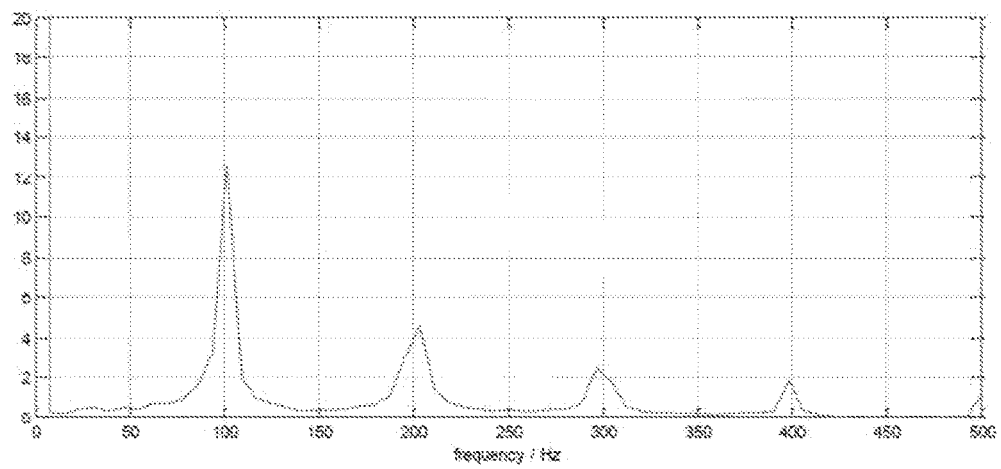
FIG. 6 shows the link voltage of FIG. 5 in the frequency domain.

FIG. 6 shows the link voltage of FIG. 5 in the frequency domain. The Fourier transform of the measurement provides an amplitude of approx. 12.5V at a fundamental frequency of 100 Hz by way of example. Now, the Fourier coefficients of a saw-tooth signal will be considered which are close to this value when using the measurement.

General Fourier Series $$f(t) = a_0 + \sum_{k=1}^{\infty} a_k \cos(k\omega t) + b_k \sin(k\omega t)$$

Fourier Series of a Saw-Tooth Curve $$f_s = -\frac{2h}{\pi}\left[\frac{1}{1}\sin(\omega t) + \frac{1}{2}\sin(2\omega t) + \frac{1}{3}\sin(3\omega t) + \ldots\right] = -\frac{2h}{\pi}\sum_{k=1}^{\infty}\frac{\sin(k\omega t)}{k}$$

$$b_k = -\frac{2h}{\pi k} b e i k \in N$$

The amplitude of the saw tooth is h. The amplitude of the saw-tooth fundamental frequency, when k=1, as given by the amount of the Fourier coefficient, is $b_1$. With h=1, the amplitude of the saw tooth corresponds to $|b_1|$ . . .

$$|b_1|=2/\pi=0.637$$

The ratio of the amplitude of the sine wave at a frequency of 100 Hz to the ripple voltage amplitude is 0.714, cf.

$$12.5V/17.5V=0.714$$

On the basis of the factor of approx. 0.7, the actual ripple voltage can be calculated back from the frequency component of the fundamental frequency. This especially holds true in the case of a stressed two-phase rectifier or a stressed three-phase rectifier, in which one phase is missing.

Figure 7:
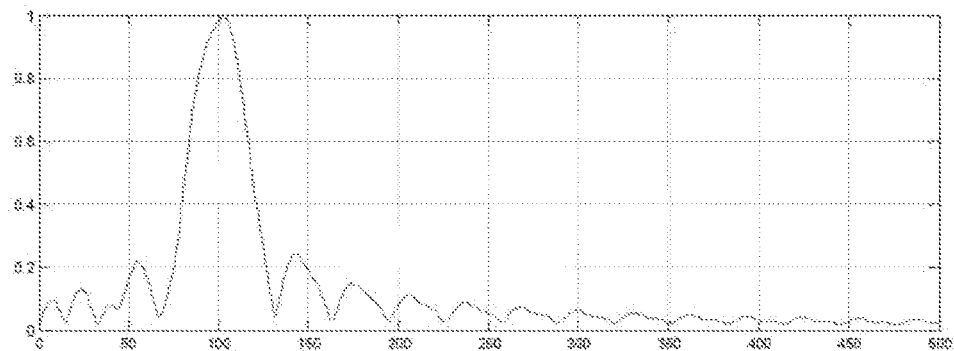
FIG. 7 shows the main lobe and the side lobes of a measuring window of an embodiment, wherein $T_s=250$ µs and $N=128$.

FIG. 7 shows the main lobe and the side lobes of a measuring window. In order to allow a certain tolerance of the mains frequency, the frequency resolution must not be selected too large. This is achieved by a lower number of samples and a greater sampling time. Thus, the main lobe is broadened.

The width of the main lobe is the double of the inversion of the measuring window and is calculated as follows $$f_{ML}=2/(N*T_s)$$

with sampling time $T_S$ and N samples.

Exemplary definitions may be as follows

Sampling time $T_s$=250 µs

Number of samples N=128.

Thus, the width of the main lobe (ML) is $$f_{ML}=2*10^6/(128*250)$$

$$f_{ML}=2*31.25 \text{ Hz}=62.5 \text{ Hz}$$

In summary, the detection of a mains phase failure in three-phase 400V devices (between 400V and 480V) is accomplished. The mains phase failure is detected on the basis of the fundamental frequency of the ripple voltage and its amplitude. In three-phase rectifiers, the fundamental frequency of the ripple voltage is the sixfold of the mains frequency. When a phase fails, the frequency of the ripple voltage is still the double of the mains frequency. In addition, the amplitude of the ripple voltage is increased. Now, the frequency component at the double mains frequency can be searched for. When the frequency component is continuously high, it is to be assumed that that a mains phase has failed.

With respect to frequency detection, it is known which frequency is searched for. This is enabled by the Goertzel filter. It provides the complex spectral component from a signal at the desired frequency. Little computing time is required and the filter can easily be realized. The transfer function and structure of a second-order Goertzel filter are suggested.

In order to eliminate aliasing effects, the link voltage can be filtered by a low-pass filter. The frequencies between 20 Hz and 400 Hz are of interest. Since the DC component of the link voltage is higher than the ripple voltage by a multiple, the frequency component at 100 Hz can be overlapped by the side lobe of the DC component. It is thus advantageous to filter (eliminate) the DC component by a high pass. The high-pass filter allows steps to pass at the input, since they have high-frequency components. This is the case in load steps. The frequency detection reacts to these steps and can lead to false decisions. Thus, the frequency detection may optionally be qualified by a sluggish PT1 element. Once the frequency component at 100 Hz has been found at a mains frequency of 50 Hz, the frequency component is related to the average link voltage. The voltage unit is omitted and the result is independent of the mains voltage. The threshold for a phase failure can thus be defined as a percentage. Not forgetting the detected factor of approx. 0.7, which is considered due to the curve form of the ripple voltage in the threshold.

From another point of view, the invention can be seen as a spectral analysis of the link voltage. Here, the amplitude is determined at the double mains frequency by means of the Goertzel algorithm (100 Hz and 120 Hz).

The amplitude is weighted with the average link voltage and is evaluated with respect to a limit value. As compared to known solutions, disturbing influence quantities, such as device state, temperature, etc., are not to be evaluated any more. Determination of the detection threshold is simplified, since only the amplitude at the one frequency of the ripple voltage is considered. Namely the frequency which arises when one mains phase fails. The robustness of the system is increased accordingly.

The exemplarily configured system of FIG. 3 has an error detection time of about 3 sec.

The features disclosed in the above description, the subsequent claims and the attached figures, both individually and in any combination, can be important for the realization of an embodiment in its various forms and can be implemented.

Even though some aspects have been described in conjunction with an apparatus, it is to be understood that these aspects also constitute a description of the corresponding method so that a block or component part of an apparatus is to be understood also as a corresponding method step or as a feature of a method step.

Analogously thereto, aspects described in conjunction with or as a method step also constitute a description of a corresponding block or detail or feature of a corresponding apparatus or function.

The described embodiments constitute an illustration (explanation and addition) of the (claimed) invention. It is to be understood that modifications and variations of the arrangements, methods and details described herein will make sense to other persons skilled in the art. Hence, it is intended that the invention be limited by the scope of protection of the patent claims only, and not by the specific details presented herein on the basis of the description and the explanations of the embodiments.

The invention claimed is:

1. A method for detecting a failure of a phase in a system supplied by multiple phases and including a DC link (5), wherein a rectified voltage (10) of the DC link (5) pulses at a multiple of a mains frequency as a fundamental wave, the method comprising:
    filtering the rectified voltage (10) for detecting a signal component at a double frequency of the mains frequency (12);
    filtering the rectified voltage (10) for detecting an average link voltage (14);
    determining a ratio signal (17) as a ratio of the average link voltage (14) to the signal component at the double frequency of the mains frequency (12); and
    detecting an error detection signal (19) from a comparison of the ratio signal (17) with an error threshold (20),
    wherein filtering (11, 25) the rectified voltage (10) for detecting the signal component at the double frequency of the mains frequency (12) is performed in parallel for alternative mains frequencies.

2. The method according to claim 1, wherein the signal component at the double frequency of the mains frequency (12) is detected by a Goertzel filter.

3. The method according to claim 2, wherein the Goertzel filter operates as a second-order filter.

4. The method according to claim 1, wherein the mains frequency is parameterizable.

5. The method according to claim 1, wherein filtering the rectified voltage (10) for detecting the signal component at the double frequency of the mains frequency (12) is preceded by high-pass filtering (21).

6. The method according to claim 1, wherein filtering the rectified voltage for detecting the average link voltage (14) is performed by means of a low-pass filter (13).

7. The method according to claim 1, wherein filtering the rectified voltage (10) for detecting the signal component at the double frequency of the mains frequency (12) and filtering the rectified voltage for detecting the average link voltage (14) is preceded by low-pass filtering (22) the rectified voltage (10).

8. The method according to claim 1, wherein detecting the error detection signal (19) from a comparison of the ratio signal (17) with the error threshold (20) is preceded by low-pass filtering (23).

9. The method according to claim 1, wherein the parallel detection of the signal components at the double frequency of alternative mains frequencies is succeeded by finding a maximum (24), the result of which forms the basis of the determination (16) of the ratio signal (17).

10. The method according to claim 1, wherein determining the error threshold (20) takes a correction factor into account, the correction factor being a ratio between an amplitude value of a spectral component and an amplitude of a ripple voltage.

11. The method according to claim 10, wherein the correction factor substantially is 0.7.

12. The method according to claim 11, wherein the correction factor is substantially in a range between 0.7 and 0.8.

13. The method according to claim 1, wherein determining the error threshold (20) takes a correction factor into account, and wherein the correction factor substantially is 0.7.

14. The method according to claim 13, wherein the correction factor is substantially in a range between 0.7 and 0.8.

15. An apparatus for detecting a failure of a phase in a system supplied by multiple phases and including a DC link (5), wherein a rectified voltage (10) of the DC link (5)

pulses at a multiple of a mains frequency as a fundamental wave, the apparatus comprising:
a first filter (11, 25) for filtering the rectified voltage (10) for detecting a signal component at a double frequency of the mains frequency (12);
a second filter (13) for filtering the rectified voltage (10) for detecting an average link voltage (14);
a determination unit (16) for determining a ratio signal (17) as a ratio of the average link voltage (14) to the signal component at the double frequency of the mains frequency (12); and
a detection circuit (18) for detecting an error detection signal (19) from a comparison of the ratio signal (17) with an error threshold (20),
wherein filtering the rectified voltage (10) for detecting the signal component at the double frequency of the mains frequency (12) is performed by the first filter (11, 25) in parallel for alternative mains frequencies.

16. The apparatus according to 15, wherein determining the error threshold (20) takes a correction factor into account, the correction factor being a ratio between an amplitude value of a spectral component and an amplitude of a ripple voltage.

17. The apparatus according to 16, wherein the correction factor substantially is 0.7.

18. The apparatus according to 17, wherein the correction factor is substantially in a range between 0.7 and 0.8.

19. The apparatus according to 15, wherein a further determination unit is provided which takes a correction factor for the error threshold (20) into account, and wherein the correction factor substantially is 0.7.

20. The apparatus according to 15, wherein the correction factor is substantially in a range between 0.7 and 0.8.

* * * * *

UNITED STATES PATENT AND TRADEMARK OFFICE
CERTIFICATE OF CORRECTION

PATENT NO. : 10,386,426 B2  
APPLICATION NO. : 15/198771  
DATED : August 20, 2019  
INVENTOR(S) : Andreas Schrepfer Page 1 of 1

It is certified that error appears in the above-identified patent and that said Letters Patent is hereby corrected as shown below:

In the Specification  
Column 3, Line 12, "(claim 11)" should read --(claim 10)--  
Column 3, Line 20, "(claims 12, 13)" should read --(claims 11, 12)--  
Column 3, Line 25, "(claim 16)" should read --(claim 15)--  
Column 3, Line 26, delete "(claim 17)"  
Column 3, Line 39, "(claims 18 to 22)" should read --(claims 16 to 20)--

Column 5, the equation at Lines 32-34 should read --
$$H_k(z) = \frac{1 - e^{-j\frac{2\pi}{N}k} \cdot z^{-1}}{1 - 2 \cdot \cos\left(2\pi \frac{k}{N}\right) \cdot z^{-1} + z^{-2}}$$
--

Column 5, the equation at Line 54 should read -- $y_k[N] = w[N] - e^{-j\frac{2\pi}{N}k} \cdot w[N-1]$ --

Column 6, the equation at Lines 14-15 should read -- $b_k = -\frac{2h}{\pi k} \text{ with } k \in N$ --

Column 6, Line 62, "assumed that that a mains phase has" should read --assumed that a mains phase has--

Signed and Sealed this  
Twenty-seventh Day of June, 2023

Katherine Kelly Vidal  
*Director of the United States Patent and Trademark Office*